United States Patent
Scharner et al.

(10) Patent No.: US 9,825,246 B2
(45) Date of Patent: Nov. 21, 2017

(54) PROCESS FOR PRODUCING AN OPTOELECTRONIC COMPONENT AND OPTOELECTRONIC COMPONENT

(71) Applicant: OSRAM OLED GmbH, Regensburg (DE)

(72) Inventors: Silke Scharner, Regensburg (DE); Thomas Wehlus, Lappersdorf (DE)

(73) Assignee: OSRAM OLED GmbH, Regensburg (DE)

(*) Notice: Subject to any disclaimer, the term of this patent is extended or adjusted under 35 U.S.C. 154(b) by 16 days.

(21) Appl. No.: 14/892,617

(22) PCT Filed: May 20, 2014

(86) PCT No.: PCT/EP2014/060294
§ 371 (c)(1),
(2) Date: Nov. 20, 2015

(87) PCT Pub. No.: WO2014/187798
PCT Pub. Date: Nov. 27, 2014

(65) Prior Publication Data
US 2016/0126486 A1    May 5, 2016

(30) Foreign Application Priority Data
May 24, 2013   (DE) .................. 10 2013 105 364

(51) Int. Cl.
| | | |
|---|---|---|
| *H01L 51/52* | (2006.01) | |
| *H01L 51/00* | (2006.01) | |
| *H01L 51/44* | (2006.01) | |

(52) U.S. Cl.
CPC ...... *H01L 51/5203* (2013.01); *H01L 51/0001* (2013.01); *H01L 51/441* (2013.01); *H01L 2251/5369* (2013.01)

(58) Field of Classification Search
CPC ............. H01L 51/5203; H01L 51/5206; H01L 51/0001; H01L 51/444; H01L 2251/5369; H01L 2251/30; H01L 33/40
See application file for complete search history.

(56) References Cited

U.S. PATENT DOCUMENTS

| | | | | |
|---|---|---|---|---|
| 6,896,864 B2* | 5/2005 | Clarke | ................... | B82Y 30/00 |
| | | | | 423/445 R |
| 9,112,165 B2* | 8/2015 | Baisl | ................... | H01L 51/0017 |

(Continued)

FOREIGN PATENT DOCUMENTS

| | | |
|---|---|---|
| CN | 101656122 A | 2/2010 |
| CN | 102971805 A | 3/2013 |

(Continued)

OTHER PUBLICATIONS

Machine translation, Martus, German Patent Pub. No. DE 102009051068 (translation date: Feb. 4, 2017), all pages.*

(Continued)

*Primary Examiner* — Victoria K Hall
(74) *Attorney, Agent, or Firm* — Viering, Jentschura & Partner mbB

(57) ABSTRACT

Various embodiments may relate to a process for producing an optoelectronic component. In the process, a carrier is provided. A first electrode is formed upon the carrier. An optically functional layer structure is formed upon the first electrode. A second electrode is formed upon the optically functional layer structure. At least one of the two electrodes is formed by disposing electrically conductive nanowires on a surface on which the corresponding electrode is to be formed, and by heating the nanowires in such a way that they plastically deform.

9 Claims, 2 Drawing Sheets

(56) References Cited

U.S. PATENT DOCUMENTS

| | | | | |
|---|---|---|---|---|
| 9,112,166 | B2* | 8/2015 | Gaynor | B82Y 20/00 |
| 2007/0080361 | A1* | 4/2007 | Malm | B82Y 20/00 257/99 |
| 2008/0292531 | A1* | 11/2008 | Ganapathiraman | B82Y 30/00 423/447.2 |
| 2008/0315763 | A1* | 12/2008 | Dobbertin | H01L 51/5088 313/512 |
| 2009/0120491 | A1 | 5/2009 | Berson et al. | |
| 2009/0121727 | A1* | 5/2009 | Lynch | G01R 27/02 324/609 |
| 2009/0123810 | A1* | 5/2009 | Devoe | H01M 8/0204 429/466 |
| 2010/0051101 | A1* | 3/2010 | Kim | B82Y 10/00 136/256 |
| 2010/0178417 | A1 | 7/2010 | Connor et al. | |
| 2011/0052926 | A1* | 3/2011 | Nakamura | H01B 1/22 428/461 |
| 2011/0204330 | A1* | 8/2011 | LeMieux | B82Y 10/00 257/15 |
| 2013/0000952 | A1* | 1/2013 | Srinivas | H01B 1/02 174/126.1 |
| 2013/0056244 | A1* | 3/2013 | Srinivas | G06F 3/041 174/250 |
| 2014/0267107 | A1* | 9/2014 | Gaynor | H01B 1/16 345/173 |
| 2014/0291662 | A1 | 10/2014 | Baisl | |
| 2014/0299359 | A1* | 10/2014 | Mittal | H01L 31/022466 174/251 |
| 2015/0000960 | A1* | 1/2015 | Gaynor | B82Y 10/00 174/251 |
| 2015/0038033 | A1* | 2/2015 | Gaynor | H01B 1/22 442/52 |
| 2015/0174687 | A1* | 6/2015 | Galela | H01L 31/02246 219/86.7 |
| 2017/0228055 | A1* | 8/2017 | Gaynor | G06F 3/041 |

FOREIGN PATENT DOCUMENTS

| | | | |
|---|---|---|---|
| DE | 102009051068 | B3 | 5/2011 |
| DE | 102011086689 | A1 | 5/2013 |
| WO | 2007048909 | A1 | 5/2007 |
| WO | 2010021433 | A1 | 2/2010 |
| WO | 2011106730 | A2 | 9/2011 |

OTHER PUBLICATIONS

Written Opinion of the International Searching Authority, International App. No. PCT/EP2014/060294 (Nov. 24, 2015), all pages.*

Z. Jin, Dynamic mechanical behavior of melt-processed multi-walled carbon nanotube/poly(methyl methacrylate) composites, Mar. 30, 2001, Chemical Physics Letters, No. 337, pp. 43-47.*

R. Haggenmueller et al., Aligned single-wall carbon nanotubes in composites by melt processing methods, Nov. 10, 2000, Chemical Physics Letters No. 330, pp. 219-225.*

J. Lee et al., Solution-Processed Metal Nanowire Mesh Transparent Electrodes, Jan. 2008, Nano Letters, vol. 8, No. 2, pp. 689-692.*

X. Zeng et al., A New Transparent Conductor: Silver Nanowire Film Buried at the Surface of a Transparent Polymer, Aug. 2010, Advanced Materials, vol. 22, pp. 4484-4488.*

L. Hu et al., Scalable Coating and Properties of Transparent, Flexible, Silver Nanowire Electrodes, Apr. 2010, ACS Nano, vol. 4, No. 5, pp. 2955-2963.*

J. Spechler & C. Arnold, Direct-write pulsed laser processed silver nanowire networks for transparent conducting electrodes, May 10, 2012, Applied Physics A: Materials Science & Processing, vol. 108, pp. 25-28.*

J. Krantz et al., Solution-Processed Metallic Nanowire Electrodes as Indium Tin Oxide Replacement for Thin-Film Solar Cells, Oct. 24, 2011, Advanced Functional Materials, vol. 21, pp. 4784-4787.*

International Search Report based on application No. PCT/EP2014/060294 (3 pages and 2 Pages of English translation) dated Sep. 26, 2014.

German Search Report based on application No. 10 2013 105 364.5 (5 pages) dated Mar. 24, 2014.

Chinese Office Action based on application No. 201480029981.0 (6 pages and 8 pages of English translation) dated Jul. 19, 2016.

* cited by examiner

FIG 1    < Prior art >
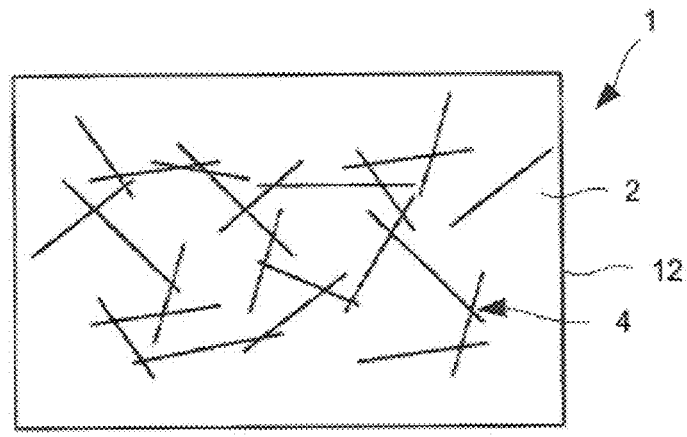
FIG 2    < Prior art >
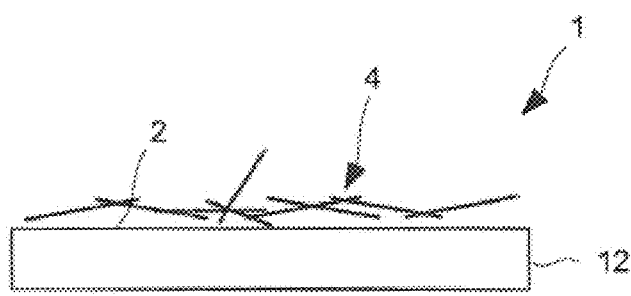
FIG 3
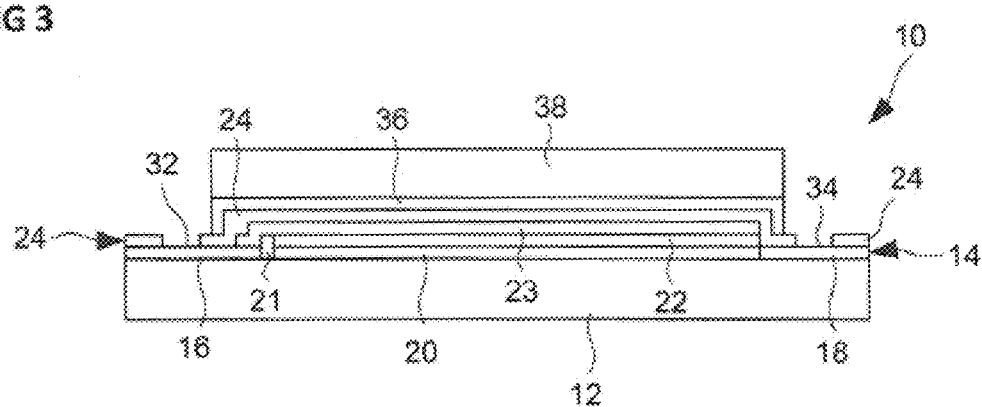

PROCESS FOR PRODUCING AN OPTOELECTRONIC COMPONENT AND OPTOELECTRONIC COMPONENT

RELATED APPLICATIONS

The present application is a national stage entry according to 35 U.S.C. §371 of PCT application No.: PCT/EP2014/060294 filed on May 20, 2014 which claims priority from German application No.: 10 2013 105 364.5 filed on May 24, 2013, and is incorporated herein by reference in its entirety.

TECHNICAL FIELD

Various embodiments may relate to a process for producing an optoelectronic component having a two-dimensional nanowire electrode and to an optoelectronic component having a two-dimensional nanowire electrode.

BACKGROUND

An optoelectronic component may, for example, be a component that emits electromagnetic radiation or a component that absorbs electromagnetic radiation. A component that absorbs electromagnetic radiation may, for example, be a photodiode or a solar cell. A component that emits electromagnetic radiation may, for example, be an LED or an OLED. An organic optoelectronic component may have an anode, a cathode and an organically functional layer system formed in between.

The organic functional layer system may have an emitter layer in which electromagnetic radiation is generated, a charge carrier pair generation layer structure composed of two or more charge carrier pair-generating layers in each case ("charge generating layer", CGL) for charge carrier pair generation, and an electron-blocking layer, also referred to as hole transport layer (HTL), and a hole-blocking layer, also referred to as electron transport layer (ETL), in order to direct the flow of current.

The anode and/or cathode may, for example, include or be formed from a metallic material, for example a metal or a semimetal, and/or another material suitable for conducting current. For example, it is possible to use nanowires, for example silver nanowires (Ag nanowires), or nanotubes, for example carbon nanotubes (C nanotubes) as material for the anode or cathode. The nanowires or nanotubes may be embedded in binders and be applied together with the binder to a surface on which the corresponding electrode is to be formed. The binder can be cured and, in the cured state, the nanowires or nanotubes may be physically and/or electrically connected to one another and fixed on the surface. The nanowires or nanotubes may be aligned in all three spatial directions within the layer formed by the binder, for example including completely or partly at right angles to the surface on which they are disposed. Because of the vertical direction component of the alignment of the nanowires or nanotubes, they may also protrude from and/or stick out of the layer of binder. Such nanowires or nanotubes protruding out of the layer of binder may constitute a major risk to the corresponding optoelectronic component, since the layer(s) formed upon the layer of binder may be damaged and/or wholly or partly short-circuited by the nanowires or nanotubes.

SUMMARY

In various embodiments, a process for producing an optoelectronic component having a two-dimensional nanowire electrode is provided, which is performable in a simple and/or inexpensive manner and/or which contributes to reliable operability of the optoelectronic component.

In various embodiments, processes for producing an optoelectronic component having a two-dimensional nanowire electrode are provided, which is producible in a simple and/or inexpensive manner and/or which is reliably operable.

In various embodiments, a process for producing an optoelectronic component is provided. In the process a carrier is provided; for example, the carrier is formed. A first electrode is formed upon the carrier. An optically functional layer structure is formed upon the first electrode. A second electrode is formed upon the optically functional layer structure. In the forming of at least one of the two electrodes, electrically conductive nanowires are disposed on a surface on which the corresponding electrode is to be formed, and the nanowires are heated in such a way that they plastically deform. Subsequently, the deformed nanowires form at least a portion of the corresponding electrode.

The deforming of the nanowires can contribute to the effect that nanowires which are aligned completely or partly at right angles to the surface become aligned parallel to the surface and, for example, flatten on the surface under an external force, for example the force of gravity and hence their own weight or a centrifugal force in a centrifuge. This contributes to the effect that a layer formed upon the corresponding electrode cannot be damaged by the nanowires, which can have the effect of reliable operation of the optoelectronic component. In addition, networking of the nanowires with one another is increased, since nanowires aligned across one another and askew with respect to one another prior to heating are now essentially in one plane and can intersect one another. This increases the probability that two nanowires will come into contact, which increases networking. High networking contributes to good and/or homogeneous current flow through the corresponding electrode and can thus contribute to reliable operation of the optoelectronic component. In addition, the nanowires in the course of subsequent cooling and the associated hardening can enter into a firm bond, for example a cohesive bond, with the layer having the surface. Optionally, it is therefore possible to dispense with the binder, which can contribute to simple and/or inexpensive production of the optoelectronic component. As an alternative to the binder, it is possible to use a solvent and/or water as carrier material for the nanowires.

If the first electrode is formed by the nanowires, the surface may be, for example, a surface of the carrier or a surface of a layer formed between the carrier and the first electrode, for example a surface of a barrier layer, a surface of an optically functional layer, for example an emission layer, or a surface of a planarization layer. The first electrode may, for example, be an anode. Alternatively or additionally, the surface, if the second electrode is formed by the nanowires, may, for example, be a surface of the optoelectronic layer structure or a surface of a layer formed between the optoelectronic layer structure and the second electrode. The second electrode may, for example, be a cathode.

The nanowires can be heated by an energy input, for example in an oven, for example by gradually raising the temperature, by laser irradiation and/or by pulsed exposure to high-energy radiation. The method for heating the nanowires can be chosen depending on the thermal stability of the carrier and/or the optoelectronic layer structure. The nanowires are heated only to such an extent that they soften and plastically deform, but do not melt entirely.

In various embodiments, the nanowires when disposed on the surface at first form a three-dimensional network. The nanowires are heated in such a way that the material of the nanowires becomes amenable to simple plastic deformation and the nanowires flatten on the surface because of their mass and hence form a two-dimensional network. The fact that the network is two-dimensional can mean, for example, that the nanowires in the network are aligned essentially parallel to the surface. The two-dimensional network may also be formed in a third dimension at right angles to the plane, for example since the nanowires lying in the plane have a real thickness that extends in the direction at right angles to the plane, and/or since the nanowires lie one on top of another at crossing points, node points and/or networking points, where these crossing points, node points and/or networking points may also extend in the third spatial direction at right angles to the plane. In other words, the two-dimensional network extends essentially in two spatial directions, with the possibility of a slight expansion, because of the thickness of the individual nanowires, in a third spatial direction at right angles thereto. The thickness of the layer formed by the nanowires in the direction at right angles to the surface may be much greater prior to heating than after heating. The thickness prior to heating may correspond, for example, to up to about a length of one of the nanowires and, after heating, may correspond to the thickness of a diameter of one, two or fewer of the nanowires.

In order that the nanowires flatten because of their mass, the surface on which the nanowires are disposed may be aligned horizontally or at least approximately horizontally, in which case gravity is exploited for the flattening of the nanowires in the plane. Alternatively or additionally, a centrifugal force can be produced by a centrifuge, which can bring about and/or promote the flattening of the nanowires on the surface.

In various embodiments, the nanowires are disposed on the corresponding electrode, the nanowires are heated and the optoelectronic component is disposed in a centrifuge and is rotated by the centrifuge in such a way that the nanowires flatten on the surface because of the action of the centrifugal force. This can contribute to the effect that plastic deforming and/or flattening of the nanowires can be achieved even with slight heating, especially when the centrifugal force achieved is greater than gravity.

In various embodiments, the degree of networking of the nanowires increases as a result of the heating and the associated deforming. In other words, in the course of heating, nanowires arranged one on top of another in the three-dimensional network, for example with binder in between, and which are therefore not in contact initially in the three-dimensional network, come into direct physical contact and/or become bonded to one another, and are in contact thereafter in the two-dimensional network.

In various embodiments, the nanowires are heated in such a way that they become cohesively bonded to one another. For example, the nanowires are pressed onto one another because of the action of gravity and/or centrifugal force, and the nanowires are heated in such a way that they are plastically deformable, such that they enter into the cohesive bond. For example, the nanowires may be heated in such a way that they are at least partly melted and/or surface melted, but not fully melted.

In various embodiments, the nanowires are heated in such a way that the material of the nanowires does not melt completely, such that a wire-like structure of the individual nanowires and a network-like structure of the nanowires is preserved. If the nanowires, in the event of excessive heating, melt completely, they lose their wire-like structure. In addition, the material of the nanowires, in the event of excessive heating and complete melting, can form round droplets, some of which are no longer connected to one another, as a result of which reliable and/or homogeneous distribution of the current and/or current flow in the corresponding electrode is no longer possible.

In various embodiments, the nanowires are embedded in a carrier material and the carrier material together with the nanowires is applied to the surface. For example, the nanowires may be embedded in a solvent and/or water. After the solvent has been applied to the surface together with the nanowires and/or in the course of heating of the nanowires, the carrier material can evaporate completely or partially.

In various embodiments, the first electrode is formed by the nanowires and the nanowires are disposed upon the carrier. To form the first electrode, the nanowires may be formed directly on the carrier or on a layer between the carrier and the first electrode, for example directly on a barrier layer, directly on an optically functional layer, for example an emission layer, or directly on a planarization layer.

In various embodiments, the second electrode is formed by the nanowires and the nanowires are disposed upon the optically functional layer structure. To form the second electrode, the nanowires may be formed directly on the optically functional layer structure or on a layer between the optically functional layer structure and the second electrode, for example directly on an optically functional layer, for example an emission layer.

In various embodiments, an optoelectronic component is provided, for example the optoelectronic component being produced, for example with the aid of the method elucidated above. The optoelectronic component includes the carrier upon which the first electrode has been formed. The optically functional layer structure has been formed upon the first electrode. The second electrode has been formed upon the optically functional layer structure. At least one of the two electrodes has the electrically conductive nanowires disposed on the surface on which the corresponding electrode has been formed. The nanowires are arranged parallel to the surface or at least approximately parallel to the surface. For example the nanowires are arranged essentially parallel to the surface.

In various embodiments, the nanowires form the two-dimensional network on the surface.

In various embodiments, the nanowires are at least partly cohesively bonded to one another. For example, the nanowires form the two-dimensional network because of their bonds.

In various embodiments, the nanowires have been embedded into the carrier material. The carrier material together with the nanowires is disposed on the surface.

In various embodiments, the first electrode has been formed by the nanowires. Alternatively or additionally, the second electrode has been formed by the nanowires.

In various embodiments, the nanowires have a diameter within a range from 5 nm to 1 μm, for example from 10 nm to 150 nm, for example from 15 nm to 60 nm, and/or a length within a range from the diameter of the corresponding nanowire to 1 mm, for example from 1 μm to 100 μm, for example from 20 μm to 50 μm. The thickness of the layer formed by the nanowires may thus be, during the production of the optoelectronic component, prior to heating, for example, 100 nm to 1 mm, for example 1 μm to 100 μm, for example 20 μm to 50 μm. The thickness of the layer formed by the nanowires may thus be, in the finished optoelectronic component, for example, 10 nm to 2 µm, for example 20 nm to 300 nm, for example 30 nm to 180 nm.

The nanowires may include or be formed from, for example, a metallic material, for example a metal or a semimetal, for example silver, gold, aluminum and/or zinc. For example, the nanowires may include an alloy including one or more of the materials mentioned.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 a top view of a substrate 12 of a conventional optoelectronic component 1;

FIG. 2 a side view of the substrate 12 according to FIG. 1;

FIG. 3 a section diagram of a working example of an optoelectronic component 10;

DETAILED DESCRIPTION

Figure 4:
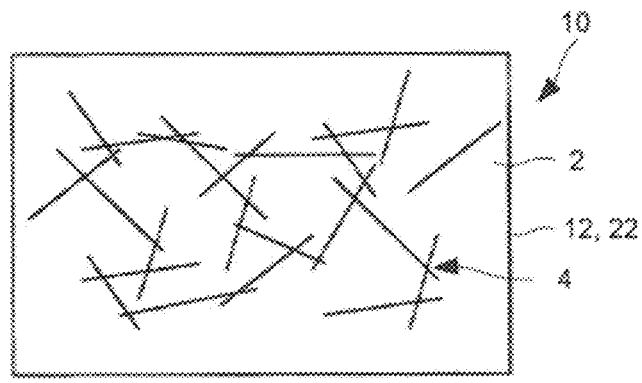
FIG. 4 a top view of the optoelectronic component 10 according to FIG. 3 during a method for producing the optoelectronic component.

In the detailed description which follows, reference is made to the appended drawings, which form part of this description and in which, for illustration, specific working examples in which the invention can be put into practice are shown. In this regard, direction terminology, for instance "top", "bottom", "front", "back", "foremost", "rearmost", etc. are used with reference to the orientation of the figure(s) described. Since components of working examples can be positioned in a number of different orientations, the direction terminology serves for illustration and is not restrictive in any way at all. It will be apparent that other working examples can be utilized and structural or logical alterations can be undertaken without departing from the scope of protection of the present invention. It will be apparent that the features of the various working examples described herein can be combined with one another, unless specifically stated otherwise. The detailed description which follows should therefore not be regarded in a restrictive manner, and the scope of protection of the present invention is defined by the appended claims.

In the context of this description, the terms "bonded", "connected" and "coupled" are used to describe a direct or indirect bond, a direct or indirect connection and a direct or indirect coupling. In the figures, identical or similar elements are given identical reference numerals, if appropriate.

An optoelectronic component may be an electromagnetic radiation-emitting component or an electromagnetic radiation-absorbing component. An electromagnetic radiation-absorbing component may, for example, be a solar cell. An electromagnetic radiation-emitting component may, for example, be an electromagnetic radiation-emitting semiconductor component and/or take the form of an electromagnetic radiation-emitting diode, of an organic electromagnetic radiation-emitting diode, of an electromagnetic radiation-emitting transistor or of an organic electromagnetic radiation-emitting transistor. The radiation may, for example, be light in the visible region, UV light and/or infrared light. In this connection, the electromagnetic radiation-emitting component may take the form, for example, of a light-emitting diode (LED), of an organic light emitting diode (OLED), of a light-emitting transistor or of an organic light-emitting transistor. The light-emitting component may, in various working examples, be part of an integrated circuit. In addition, a multitude of light-emitting components may be provided, for example accommodated in a common housing.

In a cohesive bond, the first body may be bonded to the second body by atomic and/or molecular forces. Cohesive bonds may frequently be inseparable bonds. In various configurations, a cohesive bond may be implemented, for example, as an adhesive bond, a solder bond, for example with a glass solder or metal solder, or a weld bond.

The term "translucent" or "translucent layer" may, in various working examples, be understood in such a way that a layer is translucent to electromagnetic radiation, for example to the radiation emitted by an electromagnetic radiation-emitting component, for example in one or more wavelength ranges, for example to light within a wavelength range of visible light (for example at least within part of the wavelength range from 380 nm to 780 nm). For example, the term "translucent layer" should be understood, in various working examples, to mean that essentially the entire amount of radiation absorbed into a structure (for example a layer) is also emitted from the structure (for example layer), with scattering of at least a portion of the light.

FIG. 1 shows a top view of a substrate 12 of a conventional optoelectronic component 1 during a method for producing the conventional optoelectronic component 1. More particularly, FIG. 1 shows a step of the method for producing the conventional optoelectronic component 1, in which an anode of the conventional optoelectronic component 1 is formed.

Disposed on the substrate 12 are electrically conductive nanowires 4. The electrically conductive nanowires 4 are embedded in a binder (not shown). It is apparent from FIG. 1 that the nanowires 4 extend in two dimensions, especially parallel to a surface of the substrate 12 on which the nanowires 40 are disposed. The surface of the substrate 12 on which the nanowires 4 are disposed forms a surface 2 on which the anode is to be formed.

FIG. 2 shows a side view of the substrate 12 according to FIG. 1 with the electrically conductive nanowires 4 on the surface 2, especially on the surface of the substrate 12. It is apparent from FIG. 2 that the nanowires 4, because of their own stiffness and/or because of the binder not shown in FIG. 2, can extend completely or at least partly in the direction of a third dimension, especially at right angles to the surface 2. As a result, individual nanowires 4 can also take up disadvantageous positions.

The nanowires 4 are partly in physical contact with one another, as a result of which electrically conductive bonds are formed between the nanowires 4, each contact point forming a node point or a crossing point. In this way, the nanowires 4 form a network, a networking level of the network being dependent on the number of node points or crossing points. In some cases, the nanowires 4 lie one on top of another in such a way that they cross in the top view according to FIG. 1, but do not in fact cross since they are not in contact and are askew with respect to one another. The binder material may be disposed between such superposed nanowires 4.

In the case of the conventional optoelectronic component 1, the binder with the nanowires 4 embedded therein is dried and/or cured. As a result, the nanowires 4 form a fixed three-dimensional network. In addition, the nanowires 4 and the three-dimensional network become firmly bonded to the carrier 12, for example in a cohesive manner.

FIG. 3 shows a section view of a working example of an optoelectronic component 10. The optoelectronic component 10 has a carrier 12 which may take the form, for example, of the carrier 12 elucidated above. Formed on the carrier 12 is an optoelectronic layer structure.

The optoelectronic layer structure has a first electrode layer 14 having a first contact section 16, a second contact section 18 and a first electrode 20. The first contact section 16 is electrically coupled to the first electrode 20 of the optoelectronic layer structure. For example, the first contact section 16 and the first electrode 20 may be in one-piece form. The first electrode 20 is electrically insulated from the second contact section 18 by an electrical insulation barrier 21. Formed upon the first electrode 20 is an optically functional layer structure 22, for example an organic functional layer structure, of the optoelectronic layer structure. The optically functional layer structure 22 may have, for example, one, two or more component layers as elucidated in detail further down. Formed upon the organically functional layer structure 22 is a second electrode 23 of the optoelectronic layer structure, coupled electrically to the second contact section 18. The second contact section 18 may be in one-piece form together with the second electrode 23. The first electrode 20 serves, for example, as anode or cathode of the optoelectronic layer structure. The second electrode 23 serves, correspondingly to the first electrode, as cathode or anode of the optoelectronic layer structure.

Formed upon the second electrode 23 and partly upon the first contact section 16 and partly upon the second contact section 18 is an encapsulation layer 24 of the optoelectronic layer structure which encapsulates the optoelectronic layer structure. In the encapsulation layer 24, formed upon the first contact section 16 is a first recess in the encapsulation layer 24, and upon the second contact section a second recess in the encapsulation layer 24. In the first recess in the encapsulation layer 24 a first contact region 32 is exposed, and in the second recess in the encapsulation layer 24 a second contact region 34 is exposed. The first contact region 32 serves for electrical contacting of the first contact section 16 and the second contact region serves for electrical contacting of the second contact section 18.

Formed upon the encapsulation layer 24 is a bonding agent layer 36. The bonding agent layer 36 includes, for example, a bonding agent, for example an adhesive, for example a lamination adhesive, a coating material and/or a resin. Formed upon the bonding agent layer 36 is a cover body 38. The bonding agent layer 36 serves to secure the cover body 38 on the encapsulation layer 24. The cover body 38 includes, for example, glass and/or metal. For example, the cover body 38 may be formed essentially from glass and have a thin metal layer, for example a metal foil on the glass body. The cover body 38 serves to protect the optoelectronic component 10, for example from external mechanical forces. In addition, the cover body 38 may serve for distribution and/or removal of heat which is produced in the optoelectronic component 10. For example, the glass of the cover body 38 may serve as protection from outside forces and the metal layer of the cover body 38 may serve for distribution and/or removal of the heat that arises in the operation of the optoelectronic component 10.

The bonding agent layer 36 may be applied to the encapsulation layer 24, for example, in structured form. Application of the bonding agent layer 36 in structured form to the encapsulation layer 24 means, for example, that the bonding agent layer 36 already has a given structure directly on application. For example, the bonding agent layer 36 may be applied in structured form by a dispensing or printing method.

The optoelectronic component 10 may, for example, be individualized from a component composite, by scoring the carrier 12 along its outer edges shown at the side in FIG. 1 and then breaking it, and by scoring the covering body 38 likewise along its lateral outer edges shown in FIG. 1 and then breaking it. This scoring and breaking exposes the encapsulation layer 24 over the contact regions 32, 34. Subsequently, the first contact region 32 and the second contact region 34 can be exposed in a further method step, for example by an ablation process, for example by laser ablation, mechanical scratching or an etching method.

The optoelectronic component 10 may take the form of a top emitter and/or bottom emitter. If the optoelectronic component 10 takes the form of a top emitter and bottom emitter, the optoelectronic component 10 may be referred to as optically transparent component, for example a transparent organic light-emitting diode.

The optoelectronic component 10 has the carrier 12 and an active region above the carrier 12. Between the carrier 12 and the active region, a first barrier layer (not shown) may be formed, for example a first thin barrier layer. The active region has the first electrode 20, the organic functional layer structure 22 and the second electrode 23. Formed above the active region is the encapsulation layer 24. The encapsulation layer 24 may take the form of a second barrier layer, for example of a second thin barrier layer. Above the active region and optionally above the encapsulation layer 24 is disposed the cover 38. The cover 38 may be disposed on the encapsulation layer 24, for example, by the bonding agent layer 36.

The active region is an electrically and/or optically active region. The active region is, for example, the region in the optoelectronic component 10 in which electrical current flows for operation of the optoelectronic component 10 and/or in which electromagnetic radiation is produced or absorbed.

The organic functional layer structure 22 may have one, two or more functional layer structure units and one, two or more intermediate layers, for example intermediate electrodes, between the layer structure units.

The carrier 12 may be translucent or transparent. The carrier serves as carrier element for electronic elements or layers, for example light-emitting elements. The carrier 12 may include or be formed from, for example, glass, quartz and/or a semiconductor material or any other suitable material. In addition, the carrier 12 may include or be formed from a polymer film or a laminate including one or more polymer films. The plastic may include one or more polyolefins. In addition, the plastic may include polyvinyl chloride (PVC), polystyrene (PS), polyester and/or polycarbonate (PC), polyethylene terephthalate (PET), polyether sulfone (PES) and/or polyethylene naphthalate (PEN). The carrier 12 may include or be formed from a metal, for example copper, silver, gold, platinum, iron, for example a metal compound, for example steel. The carrier 12 may take the form of a metal foil or metal-coated film. The carrier 12 may be part of or may form a mirror structure. The carrier 12 may have a mechanically rigid region and/or a mechanically flexible region or be formed in such a way.

The first electrode 20 may take the form of an anode or cathode. The first electrode 20 may be translucent or transparent. The first electrode 20 has an electrically conductive material, for example metal and/or a transparent conductive oxide (TCO) or a stack of several layers including metals or TCOs. The first electrode 20 may, for example, be a layer stack of a combination of one layer of a metal on one layer of a TCO, or vice versa. One example is a silver layer applied to an indium tin oxide layer (ITO) (Ag on ITO) or multiple ITO-Ag-ITO layers. The metal used may, for example, be Ag, Pt, Au, Mg, Al, Ba, In, Ca, Sm or Li, or other compounds, combinations or alloys of these materials. Transparent conductive oxides are transparent conductive materials, for example metal oxides, for example zinc oxide, tin oxide, cadmium oxide, titanium oxide, indium oxide or indium tin oxide (ITO). As well as binary metal-oxygen compounds, for example ZnO, $SnO_2$ or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also form part of the group of the TCOs.

The first electrode 20 has, alternatively or additionally to the materials mentioned: at least one network of electrically conductive nanowires 4 (not shown in FIG. 3), for example semiconductive nanowires or metallic nanowires, for example composed of Ag, and optionally a network of carbon nanotubes, graphene particles and graphene layers. In addition, the network of metallic nanowires may be combined with one or more electrically conductive polymers. In addition, the first electrode 20 may include electrically conductive polymers or transition metal oxides.

The first electrode 20 may have, for example, a layer thickness within a range from 10 nm to 500 nm, for example from less than 25 nm to 250 nm, for example from 50 nm to 100 nm.

The first electrode 20 may have a first electrical connection to which a first electrical potential can be applied, for example the first contact section 16. The first electrical potential can be provided by an energy source (not shown), for example by a power source or a voltage source. Alternatively, the first electrical potential may be applied to the carrier 12 and fed to the first electrode 20 indirectly via the carrier 12. The first electrical potential may, for example, be the ground potential or another predefined reference potential.

The organic functional layer structure 22 may have a hole injection layer, a hole transport layer, an emitter layer, an electron transport layer and/or an electron injection layer.

The hole injection layer may be formed on or upon the first electrode 20. The hole injection layer may include or be formed from one or more of the following materials: HAT-CN, Cu(I)pFBz, MoOx, WOx, VOx, ReOx, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro-TPD (N,N'-bis(3-methyl-phenyl)-N,N'-bis(phenyl)benzidine); spiro-NPB (N,N'-bis-(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis-(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bis(biphenyl-4-yl)amino)phenyl]-9H-fluorene; 9,9-bis[4-(N,N-bis (naphthalen-2-yl)-amino)-phenyl]-9H-fluorene; 9,9-bis[4-(N,N'-bis(naphthalen-2-yl)-N,N'-bisphenylamino)phenyl]-9H-fluorene; N,N'-bis-(phenanthren-9-yl)-N,N'-bis(phenyl) benzidine; 2,7 bis[N,N-bis(9,9-spirobifluoren-2-yl)amino]-9,9-spirobifluorene; 2,2'-bis[N,N-bis(biphenyl-4-yl)amino] 9,9-spirobifluorene; 2,2'-bis(N,N-diphenylamino)9,9-spirobifluorene; di[4-(N,N-ditolyl-amino)phenyl] cyclohexane; 2,2',7,7'-tetra(N,N-ditolyl)amino-spirobifluorene; and/or N,N,N',N'-tetranaphthalen-2-ylbenzidine.

The hole injection layer may have a layer thickness within a range from about 10 nm to about 1000 nm, for example within a range from about 30 nm to about 300 nm, for example within a range from about 50 nm to about 200 nm.

Formed on or upon the hole injection layer may be the hole transport layer. The hole transport layer may include or be formed from one or more of the following materials: NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl) benzidine); spiro-TPD (N,N'-bis(3-methylphenyl)-N,N'-bis (phenyl)-benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis-(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenyl-fluorene); spiro-TAD (2,2',7,7'-tetrakis(N,N-diphenylamino)-9,9'-spirobifluorene); 9,9-bis[4-(N,N-bis(biphenyl-4-yl)amino)phenyl]-9H-fluorene; 9,9-bis[4-(N,N-bis (naphthalen-2-yl)amino)phenyl]-9H-fluorene; 9,9-bis[4-(N, N'-bis(naphthalen-2-yl)-N,N'-bisphenylamino)-phenyl]-9H-fluorene; N,N' bis(phenanthren-9-yl)-N,N'-bis-(phenyl) benzidine; 2,7-bis[N,N-bis(9,9-spirobifluoren-2-yl)amino]-9,9-spirobifluorene; 2,2'-bis[N,N-bis(biphenyl-4-yl)amino] 9,9-spirobifluorene; 2,2'-bis(N,N-diphenylamino)-9,9-spirobifluorene; di[4-(N,N-ditolylamino)phenyl]-cyclohexane; 2,2',7,7'-tetra(N,N-ditolyl)aminospiro-bifluorene; and N,N,N',N'-tetranaphthalen-2-ylbenzidine.

The hole transport layer may have a layer thickness within a range from about 5 nm to about 50 nm, for example within a range from about 10 nm to about 30 nm, for example about 20 nm.

Formed on or upon the hole transport layer may be the one or more emitting layers, for example having fluorescent and/or phosphorescent emitters. The emitter layer may include organic polymers, organic oligomers, organic monomers, small organic non-polymeric molecules ("small molecules") or a combination of these materials. The emitter layer may include or be formed from one or more of the following materials: organic or organometallic compounds, such as derivatives of polyfluorene, polythiophene and polyphenylene (e.g. 2- or 2,5-substituted poly-p-phenylenevinylene) and metal complexes, for example iridium complexes such as blue-phosphorescing FIrPic (bis(3,5-difluoro-2-(2-pyridyl)phenyl-(2-carboxypyridyl)iridium (III)), green-phosphorescing Ir(ppy)3 (tris(2-phenylpyridin) iridium(III)), red-phosphorescing $Ru(dtb-bpy)_3*2(PF_6)$ (tris [4,4'-di-tert-butyl-(2,2')-bipyridin]ruthenium(III) complex) and blue-fluorescing DPAVBi (4,4-bis[4-(di-p-tolylamino) styryl]biphenyl), green-fluorescing TTPA (9,10-bis[N,N-di-(p-tolyl)amino]anthracene) and red-fluorescing DCM2 (4-dicyanomethylene)-2-methyl-6-julolidyl-9-enyl-4H-pyran) as nonpolymeric emitters. Non-polymeric emitters of this kind can be deposited, for example, by thermal vaporization. In addition, it is possible to use polymer emitters which can be deposited, for example, by a wet-chemical method, for example a spin-coating method. The emitter materials may suitably be embedded in a matrix material, for example an industrial ceramic or a polymer, for example an epoxide, or a silicone.

The first emitter layer may have a layer thickness within a range from about 5 nm to about 50 nm, for example within a range from about 10 nm to about 30 nm, for example about 20 nm.

The emission layer may include emitter materials which emit in one color or various colors (for example blue and yellow or blue, green and red). Alternatively, the emitter layer may include a plurality of component layers which emit light in different colors. Mixing of the different colors may result in the emission of light with a white color impression. Another alternative may be to dispose a converter material in the beam path of the primary emission produced by these layers, which at least partly absorbs the primary radiation and emits a secondary radiation of another wavelength, such as that a primary radiation (which is not yet white) gives a white color impression through the combination of primary radiation and secondary radiation.

Formed, for example deposited, on or upon the emitter layer may be the electron transport layer. The electron transport layer may include or be formed from one or more of the following materials: NET-18; 2,2',2"-(1,3,5-benzenetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolatolithium, 4-(naphthalen-1-yl)-3,5-diphenyl-4H-1,2,4-triazole; 1,3-bis[2-(2,2'-bipyridin-6-yl)-1,3,4-oxadiazol-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolato)-4-(phenylphenolato)aluminum; 6,6'-bis[5-(biphenyl-4-yl)-1,3,4-oxadiazol-2-yl]-2,2'-bipyridyl; 2-phenyl-9,10-di(naphthalen-2-yl)anthracene; 2,7-bis[2-(2,2'-bipyridin-6-yl)-1,3,4-oxadiazol-5-yl]-9,9-dimethylfluorene; 1,3-bis[2-(4-tert-butylphenyl)-1,3,4-oxadiazol-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or imides thereof; perylenetetracarboxylic dianhydride or imides thereof; and materials based on siloles having a silacyclopentadiene unit.

The electron transport layer may have a layer thickness within a range from about 5 nm to about 50 nm, for example within a range from about 10 nm to about 30 nm, for example about 20 nm.

Formed on or upon the electron transport layer may be the electron injection layer. The electron injection layer may include or be formed from one or more of the following materials: NDN-26, MgAg, $Cs_2CO_3$, $Cs_3PO_4$, Na, Ca, K, Mg, Cs, Li, LiF; 2,2',2"-(1,3,5-benzenetriyl)-tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolatolithium, 4-(naphthalen-1-yl)-3,5-diphenyl-4H-1,2,4-triazole; 1,3-bis[2-(2,2'-bipyridin-6-yl)-1,3,4-oxadiazol-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolato)-4-(phenylphenolato)aluminum; 6,6'-bis[5-(biphenyl-4-yl)-1,3,4-oxadiazol-2-yl]-2,2'-bipyridyl; 2-phenyl-9,10-di(naphthalen-2-yl)anthracene; 2,7-bis[2-(2,2'-bipyridine-6-yl)-1,3,4-oxadiazol-5-yl]-9,9-dimethylfluorene; 1,3-bis[2-(4-tert-butylphenyl)-1,3,4-oxadiazol-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]-phenanthroline; phenyldipyrenylphosphine oxide; naphthalenetetracarboxylic dianhydride or imides thereof; perylenetetracarboxylic dianhydride or imides thereof; and materials based on siloles having a silacyclopentadiene unit.

The electron injection layer may have a layer thickness within a range from about 5 nm to about 200 nm, for example within a range from about 20 nm to about 50 nm, for example about 30 nm.

In an organic functional layer structure 22 having two or more organic functional layer structure units, corresponding intermediate layers may be formed between the organic functional layer structure units. The organic functional layer structure units may each be formed individually in one configuration of the organic functional layer structure 22 elucidated above. The intermediate layer may take the form of an intermediate electrode. The intermediate electrode may be electrically connected to an external voltage source. The external voltage source may provide, for example, a third electrical potential at the intermediate electrode. The intermediate electrode may, however, also not have any external electrical connection, for example by virtue of the intermediate electrode having a floating electrical potential. Optionally, the intermediate electrode may be formed in one configuration of the first electrode.

The organic functional layer structure unit may have, for example, a layer thickness of not more than about 3 μm, for example a layer thickness of not more than about 1 μm, for example a layer thickness of not more than about 300 nm.

The optoelectronic component 10 may optionally have further functional layers, for example disposed on or upon the one or more emitter layers or on or upon the electron transport layer. The further functional layers may, for example, be internal or external absorption/emission structures which can further improve the functionality and hence the efficiency of the optoelectronic component 10.

The second electrode 23 may be formed in one of the configurations of the first electrode 20, in which case the first electrode 20 and the second electrode 23 may be identical or different. The second electrode 23 may take the form of the anode or the cathode. The second electrode 23 may have a second electrical connection to which a second electrical potential can be applied, for example the second contact section 18. The second electrical potential may be provided by the same energy source as the first electrical potential or a different energy source. The second electrical potential may be different from the first electrical potential. The second electrical potential may, for example, have a value such that the difference from the first electrical potential has a value within a range from about 1.5 V to about 20 V, for example a value within a range from about 2.5 V to about 15 V, for example a value within a range from about 3 V to about 12 V.

The encapsulation layer 24 can also be referred to as thin layer encapsulation. The encapsulation layer 24 may take the form of a translucent or transparent layer. The encapsulation layer 24 forms a barrier to chemical contaminants or atmospheric substances, especially to water (moisture) and oxygen. In other words, the encapsulation layer 24 is such that it can be penetrated at most by very small proportions, if any, of substances that can damage the optoelectronic component, for example water, oxygen or solvents. The encapsulation layer 24 may take the form of a single layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon-6,6, and mixtures and alloys thereof.

The encapsulation layer 24 may have a layer thickness of about 0.1 nm (one layer of atoms) to about 1000 nm, for example a layer thickness of about 10 nm to about 100 nm, for example about 40 nm.

The encapsulation layer 24 may include a material of high refractive index, for example one or more material(s) having a high refractive index, for example having a refractive index of at least 2.

Optionally, the first barrier layer on the carrier 12 may be formed so as to correspond with a configuration of the encapsulation layer 24.

The encapsulation layer 24 may be formed, for example, by a suitable deposition method, for example by an atomic layer deposition (ALD) method, for example a plasma-enhanced atomic layer deposition (PEALD) or a plasma-less atomic layer deposition (PLALD), or by a chemical gas phase deposition method (chemical vapor deposition (CVD)), for example a plasma-enhanced gas phase deposition method (plasma-enhanced chemical vapor deposition (PECVD)) or a plasma-less gas phase deposition method (plasma-less chemical vapor deposition (PLCVD)), or alternatively by other suitable deposition methods.

Optionally, an absorption or emission layer may be formed, for example, as external film (not shown) on the carrier 12 or as internal emission layer (not shown) in the layer cross section of the optoelectronic component 10. The absorption/emission layer may have a matrix and scattering sites distributed therein, the mean refractive index of the absorption/emission layer being greater than the mean refractive index of the layer from which the electromagnetic radiation is provided. In addition, it is also possible for one or more antireflection layers to be provided.

The bonding agent layer 36 may include, for example, adhesive and/or coating material, by which the cover 38 is disposed, for example adhesive-bonded, on the encapsulation layer 24. The bonding agent layer 36 may be transparent or translucent. The bonding agent layer 36 may include, for example, particles which scatter electromagnetic radiation, for example light-scattering particles. In this way, the bonding agent layer 36 can act as scattering layer and lead to an improvement in color angle distortion and emission efficiency.

Light-scattering particles provided may be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide or titanium oxide. Other particles may also be suitable, provided that they have a refractive index different than the effective refractive index of the matrix of the bonding agent layer 36, for example air bubbles, acrylate or hollow glass beads. In addition, it is possible, for example, for metallic nanoparticles, metals such as gold, silver, iron nanoparticles or the like to be provided as light-scattering particles.

The bonding agent layer 36 may have a layer thickness of greater than 1 μm, for example a layer thickness of several μm. In various working examples, the adhesive may be a lamination adhesive.

The bonding agent layer 36 may have a refractive index less than the refractive index of the cover 38. The bonding agent layer 36 may include, for example, a plastic of low refractive index, for example an acrylate having a refractive index of about 1.3. However, the bonding agent layer 36 may also include an adhesive of high refractive index including, for example, non-scattering particles of high refractive index and having a layer thickness-averaged refractive index corresponding roughly to the mean refractive index of the organically functional layer structure 22, for example within a range from about 1.7 to about 2.0.

Disposed on or upon the active region may be a so-called getter layer or getter structure, i.e. a laterally structured getter layer (not shown). The getter layer may be translucent, transparent or opaque. The getter layer may include or be formed from a material which absorbs and binds substances harmful to the active region. A getter layer may, for example, include or be formed from a zeolite derivative. The getter layer may have a layer thickness greater than about 1 μm, for example a layer thickness of several μm. In various working examples, the getter layer may include a lamination adhesive or be embedded in the bonding agent layer 36.

The cover 38 may be formed, for example, by a glass cover, a metal foil or a sealed polymer film cover. The cover 38 may be disposed on the encapsulation layer 24 or the active region in the geometric edge regions of the organic optoelectronic component 10, for example, by a frit bond (glass frit bonding/glass soldering/seal glass bonding) by a conventional glass solder. The cover 38 may, for example, have a refractive index (for example at a wavelength of 633 nm) of 1.55.

FIG. 4 shows a top view of the optoelectronic component 10 according to FIG. 3 during a method for producing the optoelectronic component 10. More particularly FIG. 4 shows a step in the method for producing the optoelectronic component 10, in which the first electrode 20 or the second electrode 23 is formed on a surface 2 of the optoelectronic component 10.

If the first electrode 20 is formed in the step shown in FIG. 4, the surface 2 is formed by a surface of the substrate 12 or by a surface of a layer between the substrate 12 and the first electrode 20, for example by a surface of a planarization layer, the first barrier layer or an emission layer. If the second electrode 20 is formed in the step shown in FIG. 4, the surface 2 is formed by a surface of the optically functional layer structure 22 or by a surface of a layer between the optically functional layer structure 22 and the first electrode 20, for example by a surface of an emission layer.

The nanowires 4 may be disposed on the surface 2, for example, without binder and/or without carrier material into which the nanowires 4 are embedded. Depending on whether or not a carrier material is used and, if appropriate, depending on any viscosity of the carrier material including the nanowires 4, the nanowires 4 may be disposed on the surface 2 by spin-coating, knife coating, slot die coating, spray coating, screen printing or ink-jetting. If the nanowires are embedded into the carrier material, the carrier material used may, for example, be a solvent and/or water.

Subsequently, the nanowires 4 are heated in such a way that they are plastically deformable but do not melt completely. The nanowires 4 can be heated, for example, in an oven, by laser irradiation or by pulsed exposure to high-energy radiation. The nanowires 4 may include or be formed from, for example, silver or copper.

If the nanowires 4 include silver, the nanowires 4 are, for example, heated and/or softened by a thermal treatment at thermodynamic equilibrium, for example in an oven, or by a treatment in which there is no thermodynamic equilibrium, for example by a laser treatment. The thermal treatment at thermodynamic equilibrium can be effected a temperature within a range, for example, from 630° C. to 950° C., for example from 720° C. to 945° C., for example from 860° C. to 940° C. The laser treatment can be conducted at energy densities, for example, of about 10.0 kJ/mol. However, the necessary energy density is highly dependent on the absorption of the nanowires 4. Therefore, the laser energies and/or the necessary energy densities can be chosen as a function of the temperature to be generated locally, which may, for example, be within the same aforementioned temperature ranges as in the case of thermal treatment at thermal equilibrium.

If the nanowires 4 include copper, the nanowires 4 are, for example, heated and/or softened by a thermal treatment at thermodynamic equilibrium, for example in an oven, or by a treatment in which there is no thermodynamic equilibrium, for example by a laser treatment. The thermal treatment at thermodynamic equilibrium can be effected within a range, for example, from 600° C. to 1320° C., for example from 920° C. to 1300° C., for example from 1150° C. to 1275° C. The laser treatment can be conducted at energy densities, for example, of about 13.0 kJ/mol. However, the necessary energy density is highly dependent on the absorption of the nanowires 4. Therefore, the laser energies and/or the necessary energy densities can be chosen as a function of the temperature to be generated locally, which may, for example, be within the same aforementioned temperature ranges as in the case of thermal treatment at thermal equilibrium.

Because of their mass and, for example, because of their weight, the nanowires 4 deform and flatten on the surface 2 and/or parallel to the surface 2, especially when the surface 2 is aligned horizontally or essentially horizontally. In this case, the nanowires 4 enter into further connections with one another, as a result of which further node points and/or crossing points form and the networking level of the network formed by the nanowires 4 increases.

As an alternative to weight, a centrifugal force may be utilized for the laying of the nanowires 4 down on the surface 2, by virtue of the carrier 12 and/or any optically functional layer structure 22 together with the nanowires 4 arranged thereon being disposed in a centrifuge, in such a way that the rotating causes the centrifugal force to force the nanowires 4 against the surface 2. In this case, the speed of rotation chosen may be sufficiently great that the centrifugal force is greater than the weight of the nanowires 4. In this way, even in the case of slight heating of the nanowires 4, the deformation and hence the flattening of the nanowires 4 can be achieved. This can contribute to gentle production of the optoelectronic component 10, especially when the nanowires 4 are formed upon a layer, for example of the organically functional layer structure, which is sensitive to thermal effects.

The nanowires may, for example, include a metallic material, for example a metal or a semimetal, for example silver, gold, aluminum and/or zinc.

Figure 5:
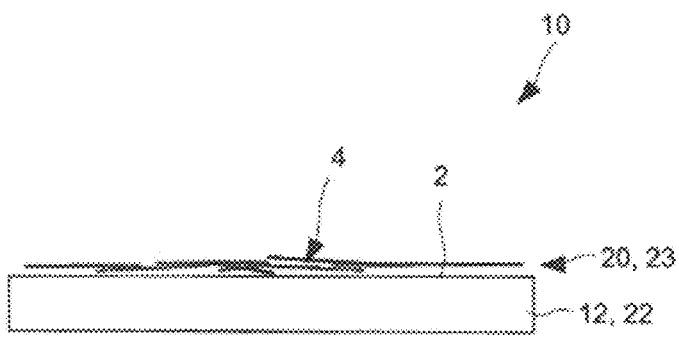
FIG. 5 a side view of the optoelectronic component 10 according to FIG. 4.

FIG. 5 shows a side view of the optoelectronic component 10 according to FIG. 4 after the step of heating the nanowires 4. The nanowires 4 then form a two-dimensional network having a small extent in the direction at right angles to the surface 2. The nanowires 4 extend essentially parallel to the surface 2 and only to a negligible degree, if any, for example because of their diameter, in the direction at right angles to the surface 2. For example, the thickness of the two-dimensional network in the direction at right angles to the surface is within a range from one diameter of the nanowires 4 to a few diameters, for example two, three or four, of the nanowires 4.

The nanowires 4 may, for example, have a diameter within a range from, for example, 5 nm to 1 µm, for example from 10 nm to 150 nm, for example from 15 nm to 60 nm. The nanowires 4 may have a length within a range from, for example, the diameter of the corresponding nanowire 4 to 1 mm, for example from 1 µm to 100 µm, for example from 20 µm to 50 µm. The thickness of the layer formed by the nanowires 4 during the production of the optoelectronic component 10 prior to heating may thus, for example, be 100 nm to 1 mm, for example 1 µm to 100 µm, for example 20 µm to 50 µm. The thickness of the layer formed by the nanowires 4 in the finished optoelectronic component may thus, for example, be 10 nm to 2 µm, for example 20 nm to 300 nm, for example 30 nm to 180 nm.

The nanowires 4 in the heated state may deform and/or be melted to such a slight degree that their wire-shaped structure is basically preserved, but they become firmly bonded to one another and to the material of the surface 2, for example in a cohesive manner.

If the nanowires 4 are embedded in the carrier material, the latter may evaporate completely or partially in the course of heating of the nanowires 4.

The nanowires 4 may form a portion, for example a component layer, of the corresponding electrode 20, 23 or the entire corresponding electrode 20, 23.

Figure 6:
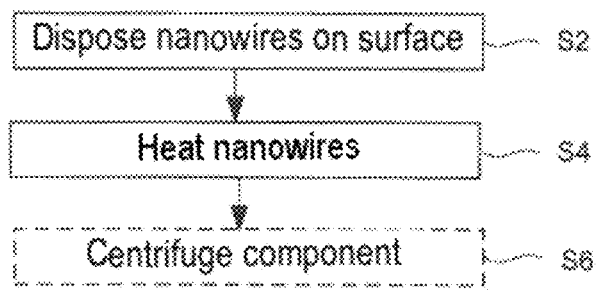
FIG. 6 a flow diagram of steps of a working example of a method for producing an optoelectronic component.

FIG. 6 shows a flow diagram of steps in a method for producing an optoelectronic component, for example of steps elucidated above and/or for example of the optoelectronic component 10 elucidated above.

The steps shown in FIG. 6 are part of a method for producing the optoelectronic component 10 in which the carrier 12 is provided, the electrodes 20, 23, the optically functional layer structure 22, the encapsulation layer 24 and/or the bonding agent layer 36 are formed and the covering body 38 is placed on.

In a step S2, the nanowires 4 are disposed on the surface 2, for example upon the carrier 12 or upon the optically functional layer structure 22.

In a step S4, the nanowires 4 are heated. The nanowires 4 are heated in such a way that they are plastically deformable but do not melt completely, and that, because of gravity or, if appropriate, centrifugal force, they become aligned parallel or at least essentially parallel to the surface 2 and/or flatten on the surface 2.

In an optional step S6, the carrier 12, optionally having the optically functional layer structure 22, with the nanowires 4 disposed thereupon, may be disposed in a centrifuge and rotated by the centrifuge in such a way that the nanowires 4 are forced against the surface 2 by the centrifugal force.

If step S6 is conducted, this can be conducted simultaneously with step S4 or shortly after step S6. More particularly, the nanowires 4 can be heated in the centrifuge during the rotation or first be heated and then rotated in the heated state.

The present disclosure is not restricted to the working examples specified. For example, it is optionally possible to form other electrically conductive layers by the heating of the nanowires 4, for example optionally one, two or more intermediate electrodes of the optoelectronic component.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A process for producing an optoelectronic component, the method comprising:
   providing a carrier,
   forming a first electrode upon the carrier,
   forming an optically functional layer structure upon the first electrode, and
   forming a second electrode upon the optically functional layer structure,
   wherein the forming of at least one of the first and second electrodes involves disposing electrically conductive nanowires on a surface on which the first or second electrode is to be formed, and heating the nanowires in such a way that the nanowires plastically deform, and wherein the deformed nanowires subsequently form at least part of the first or second electrode.

2. The process as claimed in claim 1, wherein the nanowires when disposed on the surface form a three-dimensional network and wherein the nanowires are heated in such a way that the material of the nanowires becomes amenable to simple plastic deformation and the nanowires flatten on the surface because of their mass and hence form a two-dimensional network.

3. The process as claimed in claim 2, wherein the nanowires are disposed on the corresponding electrode, the nanowires are heated and the optoelectronic component is disposed in a centrifuge and is rotated by the centrifuge in such a way that the nanowires flatten on the surface because of the action of the centrifugal force.

4. The process as claimed in claim 1, wherein a degree of networking of the nanowires increases as a result of the heating and the associated deforming.

5. The process as claimed in claim 1, wherein the nanowires are heated in such a way that the nanowires become cohesively bonded to one another.

6. The process as claimed in claim 1, wherein the nanowires are heated in such a way that the material of the nanowires does not melt completely, such that a wire-like structure of the individual nanowires and a network-like structure of the nanowires overall is preserved.

7. The process as claimed in claim 1, wherein the nanowires are embedded in a carrier material and wherein the carrier material together with the nanowires is applied to the surface.

8. The process as claimed in claim 1, wherein the first electrode is formed by the nanowires and in which the nanowires are disposed upon the carrier.

9. The process as claimed in claim 1, wherein the second electrode is formed by the nanowires and wherein the nanowires are disposed upon the optically functional layer structure.

* * * * *